(12) United States Patent
Otsuka et al.

(10) Patent No.: US 7,786,775 B2
(45) Date of Patent: Aug. 31, 2010

(54) DELAY CIRCUIT

(75) Inventors: Takeshi Otsuka, Anpachi-gun (JP); Atsushi Wada, Ogaki (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 306 days.

(21) Appl. No.: 11/411,044

(22) Filed: Apr. 26, 2006

(65) Prior Publication Data
US 2006/0245130 A1 Nov. 2, 2006

(30) Foreign Application Priority Data
Apr. 28, 2005 (JP) ............................. 2005-130964
Mar. 22, 2006 (JP) ............................. 2006-079561

(51) Int. Cl.
*H03L 7/06* (2006.01)
(52) U.S. Cl. ...................... 327/158; 327/149; 327/156
(58) Field of Classification Search ......... 327/147–150, 327/156–159
See application file for complete search history.

(56) References Cited
U.S. PATENT DOCUMENTS 6,104,224 A * 8/2000 Koshikawa ................. 327/277
6,150,847 A * 11/2000 Lu ............................... 326/93
6,222,894 B1 * 4/2001 Lee ............................. 375/376
6,229,358 B1 * 5/2001 Boerstler et al. ............ 327/116
6,756,833 B2 * 6/2004 Miura ......................... 327/277
6,801,150 B2 * 10/2004 Honda ........................ 341/161

FOREIGN PATENT DOCUMENTS
JP 2003-23343 1/2003

* cited by examiner

*Primary Examiner*—Dinh T. Le
(74) *Attorney, Agent, or Firm*—Westerman, Hattori, Daniels & Adrian, LLP

(57) ABSTRACT

The object is to provide a delay circuit capable of improving the accuracy of delay time with a simple circuit configuration. A delay circuit includes a first delay unit including a plurality of delay elements connected in series for detecting delay time characteristics of the first delay unit, a detection unit detects the number of delay elements used in the first delay unit to delay an input signal by a reference time, a second delay unit including a plurality of delay elements connected in series so as to output a signal delayed in accordance with the delay time characteristics of the first delay unit, and a selection unit selects the number of delay elements in the second delay unit to delay the input signal in accordance with the number of delay elements detected by the detection unit. The ratio between each of the delay values of the plurality of delay elements in the first delay unit and each of the delay values of the corresponding the plurality of delay elements in the second delay unit are equivalent to the ratio between the reference time and a desired delay time in the second delay unit.

13 Claims, 12 Drawing Sheets

FIG. 7

| DELAY ELEMENT | DELAY VALUE PER DELAY ELEMENT | DELAY TIME OF OutputCLK | DELAY STEP RATIO |
|---|---|---|---|
| D21 | 100 | 100 | |
| D22 | 10 | 110 | 10% |
| D23 | 11 | 121 | 10% |
| D24 | 12.1 | 133.1 | 10% |
| D25 | 13.3 | 146.4 | 10% |
| D26 | 14.6 | 161 | 10% |
| D27 | 16.1 | 177.1 | 10% |
| D28 | 17.7 | 194.8 | 10% |
| D29 | 19.5 | 214.3 | 10% |
| D30 | 21.4 | 235.7 | 10% |

FIG. 8

| DELAY ELEMENT | DELAY VALUE PER DELAY ELEMENT | DELAY TIME OF OutputCLK | DELAY STEP RATIO |
|---|---|---|---|
| D21 | 100 | 100 | |
| D22 | 10 | 110 | 10% |
| D23 | 10 | 120 | 9.1% |
| D24 | 10 | 130 | 8.3% |
| D25 | 15 | 145 | 11.5% |
| D26 | 15 | 160 | 10.3% |
| D27 | 15 | 175 | 9.4% |
| D28 | 20 | 195 | 11.4% |
| D29 | 20 | 215 | 10.3% |
| D30 | 20 | 235 | 9.3% |

FIG. 9

| DELAY ELEMENT | DELAY VALUE PER DELAY ELEMENT | DELAY TIME OF OutputCLK | DELAY STEP RATIO |
|---|---|---|---|
| D21 | 100 | 100 | |
| D22 | 15 | 115 | 15% |
| D23 | 15 | 130 | 13% |
| D24 | 15 | 145 | 11.5% |
| D25 | 15 | 160 | 10.3% |
| D26 | 15 | 175 | 9.4% |
| D27 | 15 | 190 | 8.6% |
| D28 | 15 | 205 | 7.9% |
| D29 | 15 | 220 | 7.3% |
| D30 | 15 | 235 | 6.8% |

DELAY CIRCUIT

BACKGROUND OF THE INVENTION

1. Field of the Invention

This invention relates to a delay circuit and more particularly to a technique to control the delay values of the delay circuit.

2. Description of the Related Art

In general, delay circuits are liable to have variations in delay values due to piece-to-piece variations of devices which constitute the delay circuits and environmental variations when used. Japanese Published Unexamined Patent Application No. 2003-23343 discloses that a first delay circuit detects the required number of delay elements to provide a desired delay time and a second delay circuit controls the number of delay elements by a microcomputer in accordance with the number of the delay elements detected in the first delay circuit in order to obtain the desired delay time. At this time, variations in delay values caused by the piece-to-piece variations of devices and environmental variations can be restrained by the microcomputer control.

However, in the aforementioned patent application, because the number of delay elements in the second delay circuit is controlled in accordance with the number of delay elements in the first delay circuit, i.e, the number of the delay elements is controlled based on data retaining the number of delay elements in advance, incorporation of the microcomputer into the circuit is required and it makes the circuit configuration complicated.

Additionally, when a small delay value is desired and a delay value of a delay element is large for the desired small delay value, since a decrease in the number of delay elements used leads to an increase in delay intervals of each delay element, it is difficult to make an accurate adjustment in delay time and keep the accuracy in delay time.

SUMMARY OF THE INVENTION

It is an object of the present invention to provide a delay circuit capable of improving the accuracy of delay time with a simple circuit configuration.

In order to solve the problems mentioned above, a delay circuit according to an aspect of the present invention comprises a first delay unit including a plurality of delay elements connected in series for detecting delay time characteristics of the first delay unit, a detection unit detects the number of delay elements used in the first delay unit to delay an input signal by a reference time, a second delay unit including a plurality of delay elements connected in series so as to output a signal delayed in accordance with the delay time characteristics of the first delay unit, and a selection unit selects the number of delay elements in the second delay unit to delay the input signal in accordance with the number of delay elements detected by the detection unit. The ratio between each of the delay values of the plurality of delay elements in the first delay unit and each of the delay values of the corresponding the plurality of delay elements in the second delay unit are equivalent to the ratio between the reference time and a desired delay time in the second delay unit.

According to this aspect, simply by setting up the ratio between delay values of each of delay elements in the first delay unit and each of delay elements in the second delay unit, the desired delay time can be obtained with ease. For instance, even if a short delay time is desired to be generated on a reference time corresponding to a cycle of an input clock signal or to a half cycle of the input clock signal, the desired delay time can be obtained simply by reflecting the ratio between the reference time and the delay time to the ratio between the delay values in the first delay unit and in the second delay unit. Note that equivalent substantially is sufficient for "equivalent to the ratio" in the present invention and it is not always required to be exactly the same in the ratio depending upon the accuracy requirement.

A delay circuit according to another aspect of the present invention comprises a first delay unit including a plurality of delay elements connected in series for detecting delay time characteristics of the first delay unit, a detection unit detects the number of delay elements used in the first delay unit to delay an input signal by a reference time, a second delay unit including a plurality of delay elements connected in series so as to output a signal delayed in accordance with the delay time characteristics of the first delay unit, and a selection unit selects the number of delay elements in the second delay unit to delay the input signal in accordance with the number of delay elements detected by the detection unit. Each of the delay elements in the second delay unit has a smaller delay value than each of the delay elements in the first delay unit.

According to this aspect, the desired delay time can be generated with high accuracy since the desired delay time can be generated with a shorter delay step size than the delay value used in detecting the delay time characteristics. Additionally, by equalizing the ratio between the delay value of delay elements in the first delay unit and the delay value of delay elements in the second delay unit to the ratio between the reference time and the desired delay time in the second delay unit, the delay time can be generated easily with the shorter delay step size.

In addition to the aspects mentioned above, the delay value of the delay elements in the second delay unit may be larger than the delay value of the delay elements in the first delay unit. For example, when the delay value of the second delay unit is 1.1 times as large as the delay value of the first delay unit, a delay time which is 1.1 times as large as a reference time of an input clock signal is generated. In this manner, not only multiplying the input clock signal, but also a variety of delay times can be obtained with ease.

The first delay unit described hereinbefore, may have a plurality of branch points in order to output a variety of signals with different delay times and may dispose each of the delay elements between two adjacent branch points. In addition, the second delay unit may have a plurality of branch points so as to be connected to the selection unit and may dispose each of delay elements between two adjacent branch points.

Delay circuits described hereinbefore, for instance, may be used to generate a variety of clock signals inputted to each circuit such as a comparator and the like which are included in an analog-to-digital converter.

According to the present invention, delay time of a delay circuit can be improved in accuracy with a simple circuit configuration.

It must be noted that any combinations and arrangements of the aforementioned constituents and any modifications of the present invention on methods, devices, and systems, may be resorted to as modes of the present invention.

BRIEF DESCRIPTION OF THE DRAWINGS

FIG. 7 is a table showing an example of delay values of the eleventh to the twentieth delay elements D21 to D30 in a second delay unit 14 according to a fourth embodiment of the present invention;

FIG. 8 is another table showing an example of delay values of the eleventh to the twentieth delay elements D21 to D30 in the second delay 14 unit according to the fourth embodiment of the present invention;

FIG. 9 is an additional table showing a comparative example of delay values of the eleventh to twentieth delay elements D21 to D30 in the second delay unit 14 according to the fourth embodiment of the present invention;

DETAILED DESCRIPTION OF THE PREFERRED EMBODIMENTS

First Embodiment

Figure 1:
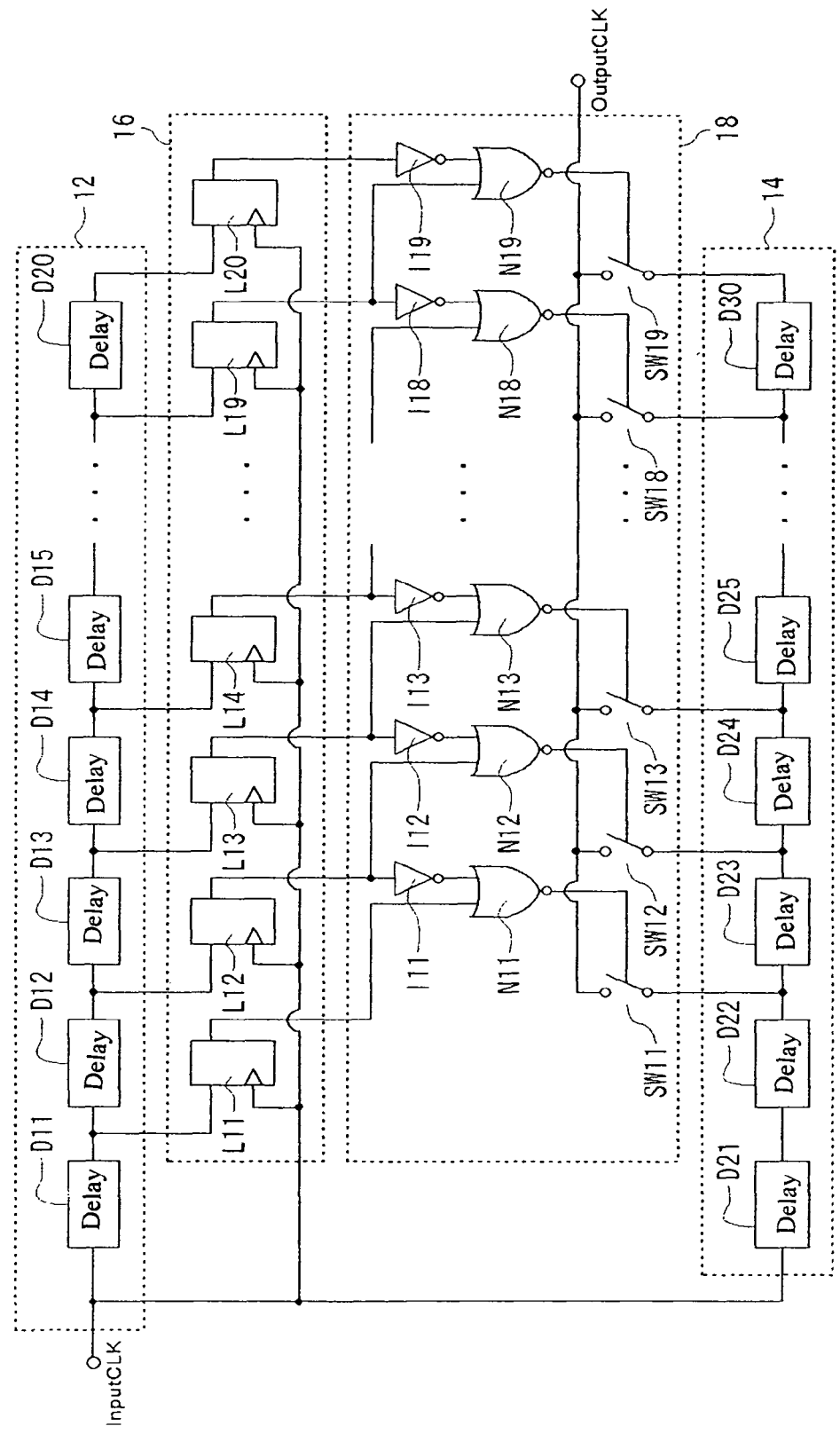
FIG. 1 is a circuit diagram showing a structure of a delay circuit according to a first embodiment of the present invention.

FIG. 1 is a circuit diagram showing a structure of a delay circuit according to a first embodiment of the present invention. A delay circuit 10 includes a first delay unit 12, a second delay unit 14, a detection unit 16, and a selection unit 18. Both the first delay unit 12 and the second delay unit 14 have a plurality of delay elements. Both the first delay unit 12 and the second delay unit 14 according to the first embodiment have ten delay elements, respectively. The first delay unit 12 delays an input clock signal InputCLK by a reference time and measures the delay time characteristics of delay elements in the first delay unit 12 by detecting the number of delay elements used for delaying. Note that the delay time characteristics means variations in delay values caused by an internal or an external factor such as variations in the manufacturing process of the circuit, variations in temperature, and fluctuations in the power supply voltage. The second delay unit 14 delays the same input clock signal as the input clock signal InputCLK for the first delay unit 12 in accordance with the number of delay elements used for delaying in the first delay unit 12. The selection unit 18 sets up the required number of delay elements in the second delay unit 14 in accordance with the number of delay elements used for delaying in the first delay unit 12. Since the total number of delay elements in the first delay unit 12 is the same as the total number of delay elements in the second delay unit 14, delay with better accuracy can be generated by reflecting the delay time characteristics in the first delay unit 12 to delay in the second delay unit 14.

The first delay unit 12 includes the first to the tenth delay elements connected in series, D11 to D20. The second delay unit 14 includes the eleventh to the twentieth delay elements connected in series, D21 to D30. Each delay value of the eleventh to the twentieth delay element D21 to D30 is smaller than each delay value of the first to the tenth delay element D11 to D20. The ratio between the delay value in the eleventh to the twentieth delay element D21 to D30 and the delay value in the first to the tenth delay element D11 to D20 is 1:5. The ratio is configured to be the same ratio between a desired delay time and a reference time. Therefore, the desired delay time can be obtained with ease by configuring the ratio between a delay value in the first delay unit and a delay value in the second delay unit.

The detection unit 16 includes a plurality of latch circuits. The detection unit 16 according to the first embodiment includes the first to the tenth latch circuit L11 to L20 as ten latch circuits, which are the same in number with the delay elements in the first delay unit 12. Each of the first to the tenth latch circuit L11 to L20 receives the same input clock signal as the input clock signal InputCLK which the first delay unit 12 receives. Each of the first to the tenth latch circuit L11 to L20 outputs a retained data on the rising edge of the input clock signal InputCLK and resets the retained data on the falling edge of the input clock signal. As the retained data, for instance, the first latch circuit L11 retains the output from the first delay element D11 and the second latch circuit L12 retains the output from the second delay element D12. In this manner, each of the latch circuits corresponds to one of the delay elements in the first delay unit 12 on a one-on-one basis, respectively, retains the data outputted from the corresponding delay element, and outputs the retained data on the rising edge of the input clock signal InputCLK. At this time, all the delay elements used for delaying in the first delay unit 12 output "Low" and all the delay elements which are not used for delaying output "High". Which delay element outputs "High" or "Low" cannot always be the same because of variations in the manufacturing process, variations in temperature, and fluctuations in the power supply voltage. Thus, detecting the number of delay elements used in the first delay unit 12 for delaying the input clock signal InputCLK by the reference time can be achieved since the detection unit 16 detects the output from each of delay elements.

The selection unit 18 includes the first to the ninth NOR gates N11 to N19 as a plurality of NOR gates, the first to the ninth NOT gate I11 to I19 as a plurality of NOT gates, and the first to the ninth switch SW11 to SW19 as a plurality of switches. Each of the first to the ninth NOR gates N11 to N19 corresponds to one of the second to the tenth latch circuit L12 to L20 on a one-on-one basis, respectively. The first NOR gate N11 receives a signal obtained by inverting an output signal from the second latch circuit L12, also receives an output signal from the first latch circuit L11, and outputs the result of the NOR operation with these two signals. The first NOT gate I11 inverts the output signal from the second latch circuit L12. The second NOR gate N12 receives a signal obtained by inverting an output signal from the third latch circuit L13, also receives an output signal from the second latch circuit L12, and outputs the result of the NOR operation with these two signals. The second NOT gate I12 inverts the output signal from the third latch circuit L13.

In this manner, each of NOR gates receives a signal obtained by inverting an output signal from the corresponding latch circuit and a signal from a latch circuit before the corresponding latch circuit, and outputs the result of the NOR operation with these two signals. Each of the switches is turned on/off in response to the output from each of the NOR gates. For example, the first switch SW11 is turned on when the first NOR gate N11 outputs "High" and is turned off when the first NOR gate N11 outputs "Low". When the second switch SW12 is turned on, an output from the thirteenth delay element D23 is outputted via the second switch SW12 as an output clock signal OutputCLK. Thus, each of the first to the ninth switch SW11 to SW19 corresponds to one of the twelfth to the twentieth delay element D22 to D30 on a one-on-one basis, respectively. When a switch is turned on, the output from the corresponding delay element is outputted via the switch turned on to the outside of the delay circuit 10 as an output clock signal OutputCLK. In this way, the selection unit 18 can select the number of delay elements used in the second delay unit 14 in accordance with the number of delay elements used in the first delay unit 12.

Note that the delay value of the first delay element D11 may be equivalent or different from the delay value of any other delay elements in the first delay unit 12. Also, note that the delay value of the eleventh delay element D21 may be equivalent or different from the delay value of any other delay elements in the second delay unit 14. For instance, when a desired delay time is long enough as compared to a range of variations in delay values, the first delay element D11 or the eleventh delay element D21 may be configured with a larger delay value than the other delay elements in each delay unit in order to earn a very first delay time long enough to reach the range of variations in delay values by a single delay element. Thus, adjusting the delay value of the very first delay element, (hereinafter referred to as "primary delay elements") the first delay element D11 and the eleventh delay element D21, gives simplification in the configuration of the delay elements. Also, the second to tenth delay elements D12 to D20 may have the equivalent delay value or may have different delay values. The twelfth to the twentieth delay element D22 to D30 may have the equivalent delay value or may have different delay values as well.

In this embodiment, the number of delay elements in the first delay unit 12 is the same as the number of the delay elements in the second delay unit 14 and each of delay elements in the first delay unit 12 corresponds to one of the delay elements in the second delay unit 14 on one-on-one basis, respectively. Hence, the delay time characteristics can be cancelled out to generate a desired delay time with high accuracy by using the same number of delay elements in the second delay unit 14 as the number of delay elements used in the first delay elements in delay 12 for delaying by a reference time. Also, generating the desired delay time can be achieved with such a simple configuration that each of delay elements in the first delay unit 12 matches one of the delay elements in the second delay unit 14 on a one-on-one basis. In the modification of this embodiment, the number of delay elements in the first delay unit 12 may be different from the number of delay elements in the second delay unit 14. In this case, however, it is preferable that an increase and decrease in the number of delay elements used in the first delay unit 12 for delaying by the reference time be equivalent to an increase and decrease in the number of delay elements to be used in the second delay unit 14. In this configuration, a part of the delay elements in the first delay unit 12 corresponds to one of the delay elements in the second delay unit 14 at least. Consequently, a desired delay time can be generated with a simple configuration as well as the case with the delay elements in the first delay unit 12 being the same in number with the delay elements in the second delay unit 14.

Figure 2:
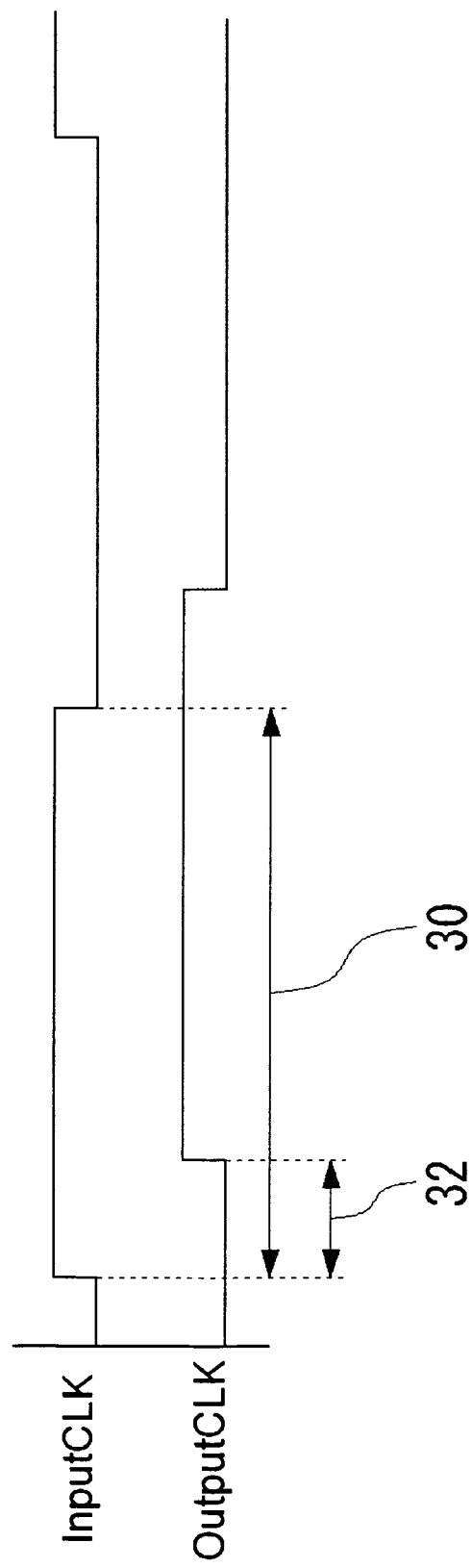
FIG. 2 is a timing chart showing a delay value of an output clock signal OutputCLK on an input clock signal InputCLK.

FIG. 2 is a timing chart showing a delay value of an output clock signal OutputCLK on an input clock signal InputCLK. An upper signal pulse indicates the input clock signal InputCLK and a lower signal pulse indicates the output clock signal OutputCLK. The input clock signal InputCLK and the output clock signal OutputCLK have their duty cycle of 50%, and the clock cycle and the pulse duration of both the input clock signal InputCLK and the output clock signal OutputCLK are the same, respectively. However, the output clock signal OutputCLK is delayed from the input clock signal InputCLK. The reference time 30 in the first delay unit 12 corresponds to a half clock cycle of the input clock signal InputCLK, and the delay time 32 in the second delay unit 14 corresponds to one-fifth of the reference time 30. This ratio is the same as the ratio between the delay value of the delay elements in the first delay unit 12 and the delay value of the delay elements in the second delay unit 14. That is to say, in order to obtain a desired delay time, the ratio between the delay value in the first delay unit 12 and the delay value in the second delay unit 14 has only to be equivalent to the ratio between the reference time 30 in the first delay unit 12 and the delay time 32 in the second delay unit 14. In this embodiment, the output clock signal OutputCLK delayed by one-tenth cycle of the input clock signal InputCLK can be obtained since the delay time which is one-fifth period of a half clock cycle of the input clock signal InputCLK is generated.

Figure 3:
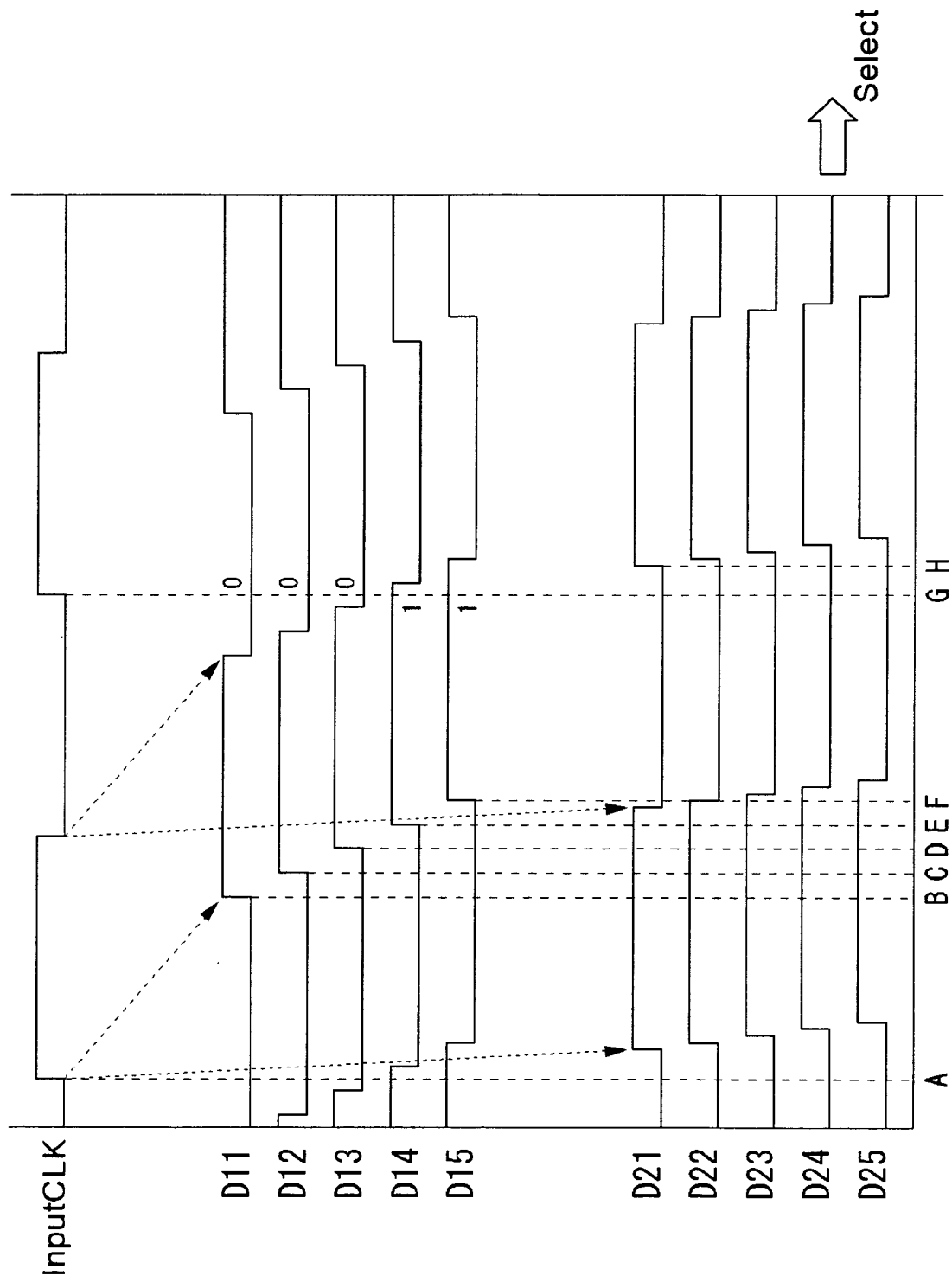
FIG. 3 is a timing chart showing delay values of each delay element on an input clock signal InputCLK.

FIG. 3 is a timing chart showing delay values of each delay element on an input clock signal InputCLK. On the timing of A on the rising edge of the input clock signal InputCLK, the first delay element D11 as the primary delay element outputs a delayed signal in accordance with the delay value on the rising edge which is the timing of B. For the rest of delay elements, the second delay element D12, the third delay element D13, the fourth delay element D14, and the fifth delay element D15 have the rising edges on the timing of B, C, D, E, and F, respectively. Each of the time intervals between the timing of B, C, D, E, and F corresponds to one of the delay values of the second delay element D12, the third delay element D13, the fourth delay element D14, and the fifth delay element D15, respectively.

As the input clock signal InputCLK has the falling edge at a half cycle later from the rising edge, the first delay element D11, the second delay element D12, the third delay element D13, the fourth delay element D14, and the fifth delay element D15 also output signals with the falling edges sequentially at a half cycle later from each rising edges. While the first delay element D11, the second delay element D12, the third delay element D13, the fourth delay element D14, and the fifth delay element D15 have their falling edges sequentially, the input clock signal InputCLK has the rising edge again at a timing of G which is at a half cycle later from the falling edge of the input clock signal InputCLK. At the timing of C, because the detection unit 16 outputs what the first to the tenth latch circuits L11 to L20 retain, the detection unit 16 outputs "Low" as the data retained in the first to the third delay element D11 to D13 and outputs "High" as the data retained in the fourth and the fifth delay elements D14 and D15. After the input clock signal InputCLK also inputted to the second delay unit 14 has the rising edge at the timing of G, the eleventh delay element D21 as a primary delay element delays the input clock signal InputCLK in accordance with the delay value of the delay element and outputs a signal with the rising edge at a timing of H. For the rest of the delay elements that follow, the twelfth delay element D22, the thirteenth delay element D23, the fourteenth delay element D24, and the fifteenth delay element D25 output signals sequentially delayed by each delay values. Among the first to the ninth NOR gates N11 to N19 in the selection unit 18, only the third NOR gate N13 outputs "High" which is the result of NOR operation with "Low" from the third delay element D13 and another "Low" which is inverted from "High" outputted from the fourth delay element D14. Therefore, the third switch SWI3 is turned on and the output from the corresponding fourteenth delay element D24 is selected to be outputted outside of the delay circuit 10 as an output clock signal OutputCLK.

Figure 4:
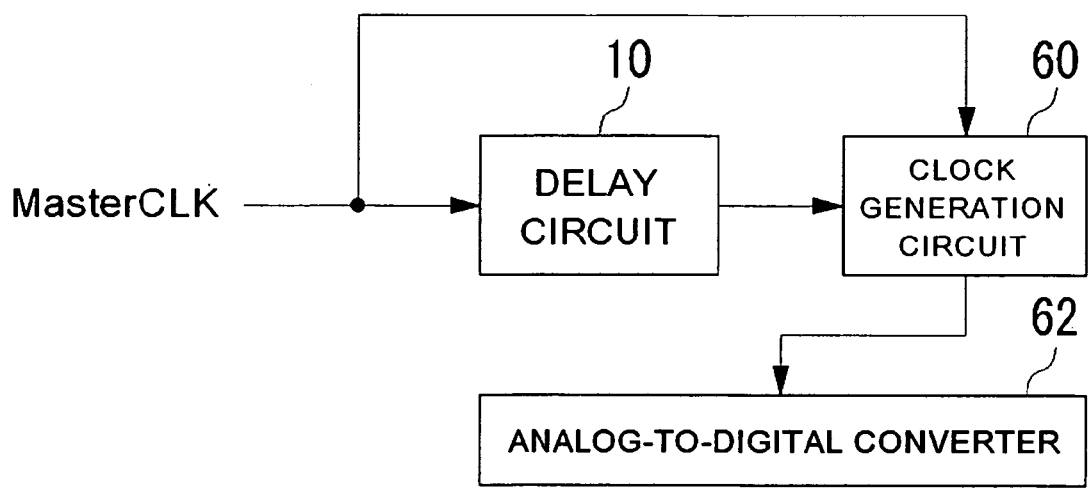
FIG. 4 is a block diagram showing an electronic circuit including the delay circuit according to the first embodiment of the present invention.

FIG. 4 is a block diagram showing an electronic circuit including the delay circuit according to the first embodiment of the present invention. The electronic circuit 100 includes the delay circuit 10, a clock generation circuit 60, and an analog-to-digital converter 62. The clock generation circuit 60 receives a master clock signal MasterCLK and a delayed clock signal obtained by delaying the master clock signal MasterCLK for a desired time by the delay circuit 10. The clock generation circuit 60 generates a variety of clock signals using the two input signals and outputs the clock signals to the analog-to-digital converter 62. The analog-to-digital converter 62 may be one of an algorithmic-type analog-to-digital converter and a pipelined analog-to-digital converter. The analog-to-digital converter 62 may include any circuits such as a comparator, an inverting amplifier, a non-inverting amplifier, a differentiating circuit, an integrating circuit, an adding circuit, a subtracting circuit, a voltage-follower circuit, a various of filters, an oscillating circuit, a peak-value detecting circuit, and a sample-and-hold circuit or the like. The various clock signals generated by the clock generation circuit 60 are employed as a clock signal for each of the circuits. In particular, the algorithmic-type analog-to-digital converter and the pipelined analog-to-digital converter require a variety of clock signals since the precision in analog-to-digital conversion are different between the first time (or step) conversion and the other times (or steps) conversion that follow. The delay circuit 10 according to the embodiment is robust to piece-to-piece variations in the manufacturing process, variations in temperature, and fluctuations of the power supply voltage, and generates delayed clock signals with high accuracy which makes it possible to achieve an excellent analog-to-digital conversion with high accuracy.

In the embodiment as described above, by configuring the delay values of the delay elements in the second delay unit 14 smaller than the delay values in the first delay unit 12, a delay time can be generated with a shorter delay step size than the delay value used in detecting the delay time characteristics. Therefore, a desired delay time can be generated with high accuracy. By equalizing the ratio between the delay value of each delay element in the first delay unit 12 and that in the second delay unit 14 to the ratio between a reference time and the desired delay time, the desired delay time can be generated with the short delay step size easily. Only by setting up the ratio between the delay value of delay elements in the first delay unit 12 and that in the second delay unit 14, the desired delay time can be obtained with ease. Since the number of delay elements and delay intervals of each element are enough for obtaining the desired delay time, the number of delay elements used for delaying can be detected precisely.

Second Embodiment

A delay circuit 10 according to a second embodiment has a major part of the circuit organization in common with the delay circuit according to the first embodiment, however, it differs in circuit configuration of the selection unit, circuit configuration of the second delay unit, and selection method of delay elements in the second delay unit from that in the delay circuit according to the first embodiment. In particular, the selection unit selects the delay element which has to receive an input clock signal InputCLK for delaying among a plurality of delay elements in the second delay unit in the second embodiment, on the other hand, the selection unit selects the delay element which has to output a delayed signal among a plurality of delay elements in the second delay unit in the first embodiment. Hereinafter, differences from the first embodiment will be described mainly and the description of common parts with the first embodiment will be omitted.

Figure 5:
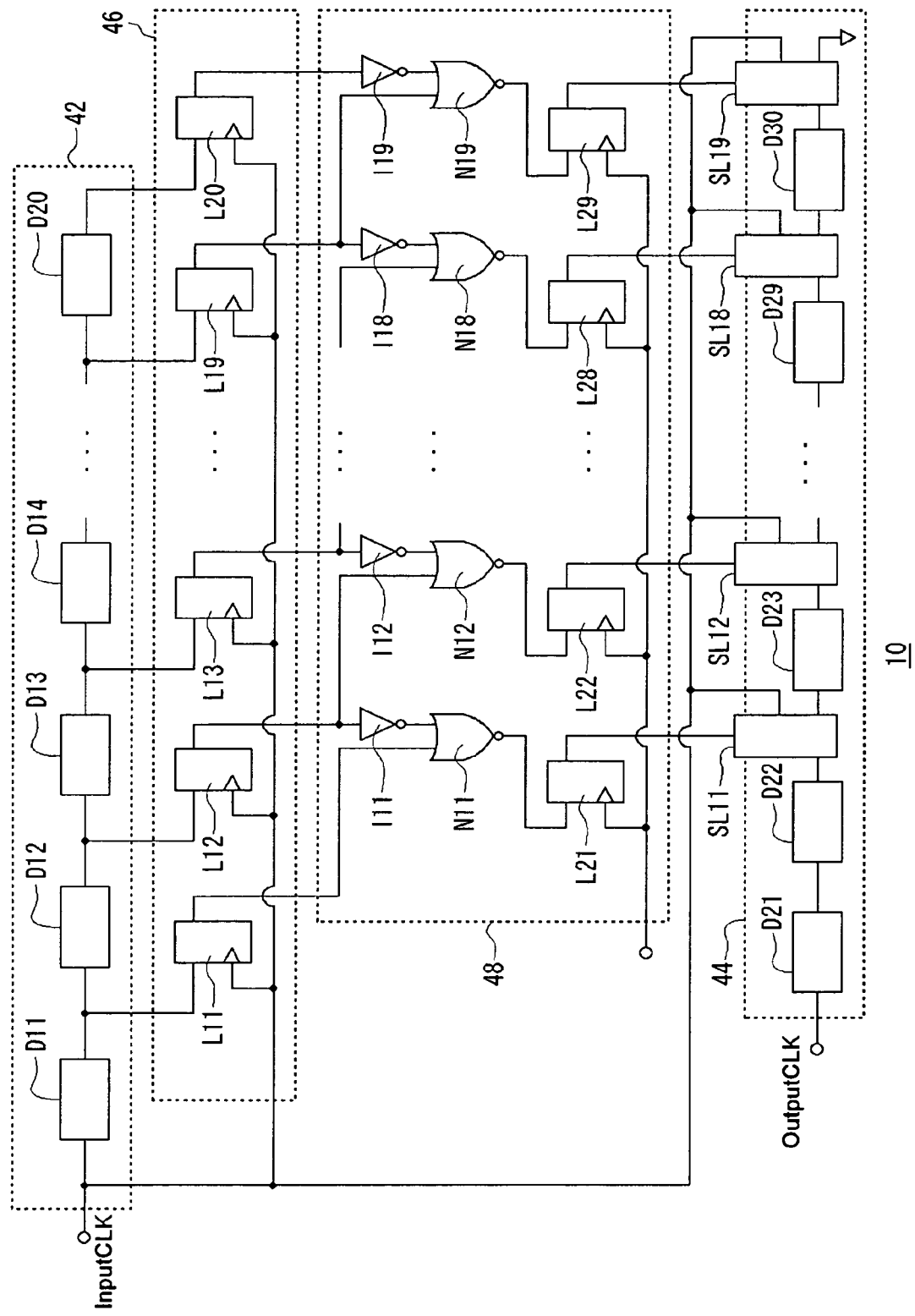
FIG. 5 is a circuit diagram showing a structure of a delay circuit according to a second embodiment of the present invention.

FIG. 5 is a circuit diagram showing a structure of a delay circuit according to a second embodiment of the present invention. In the second embodiment, the circuit configurations of a first delay unit 42 and a detection unit 46 are the same as the circuit configurations of the first delay unit 12 and the detection unit 16, respectively. A selection unit 48 includes the first to the ninth NOR gate N11 to N19 as a plurality of NOR gates, the first to the ninth NOT gate I11 to I19 as a plurality of NOT gates, and the eleventh to the nineteenth latch circuit L21 to L29 as a plurality of latch circuits. The first to the ninth NOR gates and the first to the ninth NOT gates are allocated and connected to the corresponding gates on one-on-one basis, respectively in the same way as in the first embodiment. The first to the ninth switches SW11 to SW19 in the first embodiment are replaced with the eleventh to the nineteenth latch circuits L21 to L29, each of which is connected to one of the first to the ninth NOR gates N11 to N19. Each of the first to the ninth NOR gates N11 to N19 corresponds to one of the eleventh to the nineteenth latch circuits L21 to L29 on one-on-one basis, respectively. The output from each of the first to the ninth NOR gates N11 to N19 is retained by the corresponding eleventh to the nineteenth latch circuit L21 to L29. As a clock signal is inputted to the eleventh to the nineteenth latch circuits L21 to L29, the data retained by each of the eleventh to the nineteenth latch circuit L21 to L29 is outputted to the second delay unit 44 in response to the edges of the clock signal.

The second delay unit 44, similar to the first embodiment, includes the eleventh to the twentieth delay elements D21 to D30. However, in the second delay unit 44, an input clock signal InputCLK is delayed in the order corresponding to the twentieth delay element D30, the nineteenth delay element D29, . . . , the thirteenth delay element D23, the twelfth delay element D22, the eleventh delay element D21. In addition, the first to the ninth selection circuits SL11 to SL19 are incorporated just before the twelfth to the twentieth delay elements D22 to D30, respectively. The twelfth to the twentieth delay elements D22 to D30 and the first to the ninth selection circuit SL11 to SL19 are allocated alternately and connected in series. Data retained by the eleventh to the nineteenth latch circuits L21 to L29 in the selection unit 48 are inputted to the first to the ninth selection circuit SL11 to SL19 respectively in response to a clock signal. Each of the eleventh to the nineteenth latch circuits L21 to L29 corresponds to one of the first to the ninth selection circuit SL11 to SL19 on one-on-one basis, respectively. The first to the ninth selection circuits SL11 to SL19 receive the same input clock signal InputCLK as the input clock signal which the first delay unit 42 and the detection unit 46 receive. Among the first to the ninth selection circuits SL11 to SL19, the selection circuits inputted "High" from any of the eleventh to the nineteenth latch circuits L21 to L29 output the input clock signal InputCLK to corresponding delay elements among the twelfth to the twentieth delay elements D22 to D30. The delay element which receives the input clock signal InputCLK outputs the signal from right to left in the figure. A plurality of delay elements adds delays to the input clock signal InputCLK sequentially and outputs the output clock signal OutputCLK outside of the delay circuit 10. Thus, selection unit 48 can select any of delay elements in the second delay unit 44 to input the input clock signal InputCLK.

For instance, when the first to the third delay elements D11 to D13, three delay elements are used in the first delay unit 42 for delaying by a reference time, among the first to the ninth NOR gates N11 to N19 in the selection unit 48, only the second NOR gate N12 outputs "High" and all of the other NOR gates output "Low". The twelfth latch circuit L22 inputs "High" to the second selection circuit SL12 and the second selection circuit SL12 inputs the input clock signal InputCLK to the thirteenth delay element D23. The output clock signal obtained by adding delays in the order corresponding to the thirteenth delay element D23, the twelfth delay element D22, the eleventh delay element D21 is outputted outside of the delay circuit 10. Consequently, three delay elements used in the second delay unit 44, which is the same in number with delay elements used in the first delay unit 42 for delaying.

In case that the number of delay elements in the first delay unit 42 and the second delay unit 44 is comparatively a lot or that the frequency of the input clock signal InputCLK is comparatively high, there is a possibility that more than two delay elements in both sides output "High" at a time during one clock cycle by starting the next delay before the last delay has implementation of delaying by the final delay element. The delay circuit 10 according to this embodiment has a feature of selecting a delay element among a plurality of delay elements in the second delay unit 44 to input the input clock signal InputCLK. So, the input clock signal inputting to the delay element selected in accordance with the output from the closest latch circuit to the first latch circuit, the eleventh latch circuit L21 among a plurality of latch circuits in the selection unit 48, is delayed by priority and is outputted outside of delay circuit 10 as the output clock signal OutputCLK. Therefore, selection of the number of delay elements in the second delay unit 44 can be optimized without being influenced by the detecting result of the latter delay elements.

Third Embodiment

A delay circuit 10 according to a third embodiment has a major part of the circuit organization in common with the delay circuits according to the first and the second embodiments, however, it differs in circuit configuration of the selection unit, circuit configuration of the second delay unit, and selection method of delay elements in the second delay unit from that in the delay circuits according to the first and the second embodiments. In particular, there is a difference from the first and the second embodiments on the method of selecting the first and the last delay elements in the second delay unit. For instance, when a reference time is elapsed in the first delay unit, even if the all delay elements output "High (or Low)", output signals from the first and the final delay elements in the second delay unit are forced to be selected and always saved for the output clock signal OutputCLK. By this way, even the delay time characteristics in the first delay unit 12 resides beyond the limit of configuration, a situation that none of delay elements in the second delay unit is selected and no output clock signal OutputCLK is generated can be avoided. Hereinafter, differences from the first embodiment will be described mainly and the description of common parts with the first embodiment will be omitted.

Figure 6:
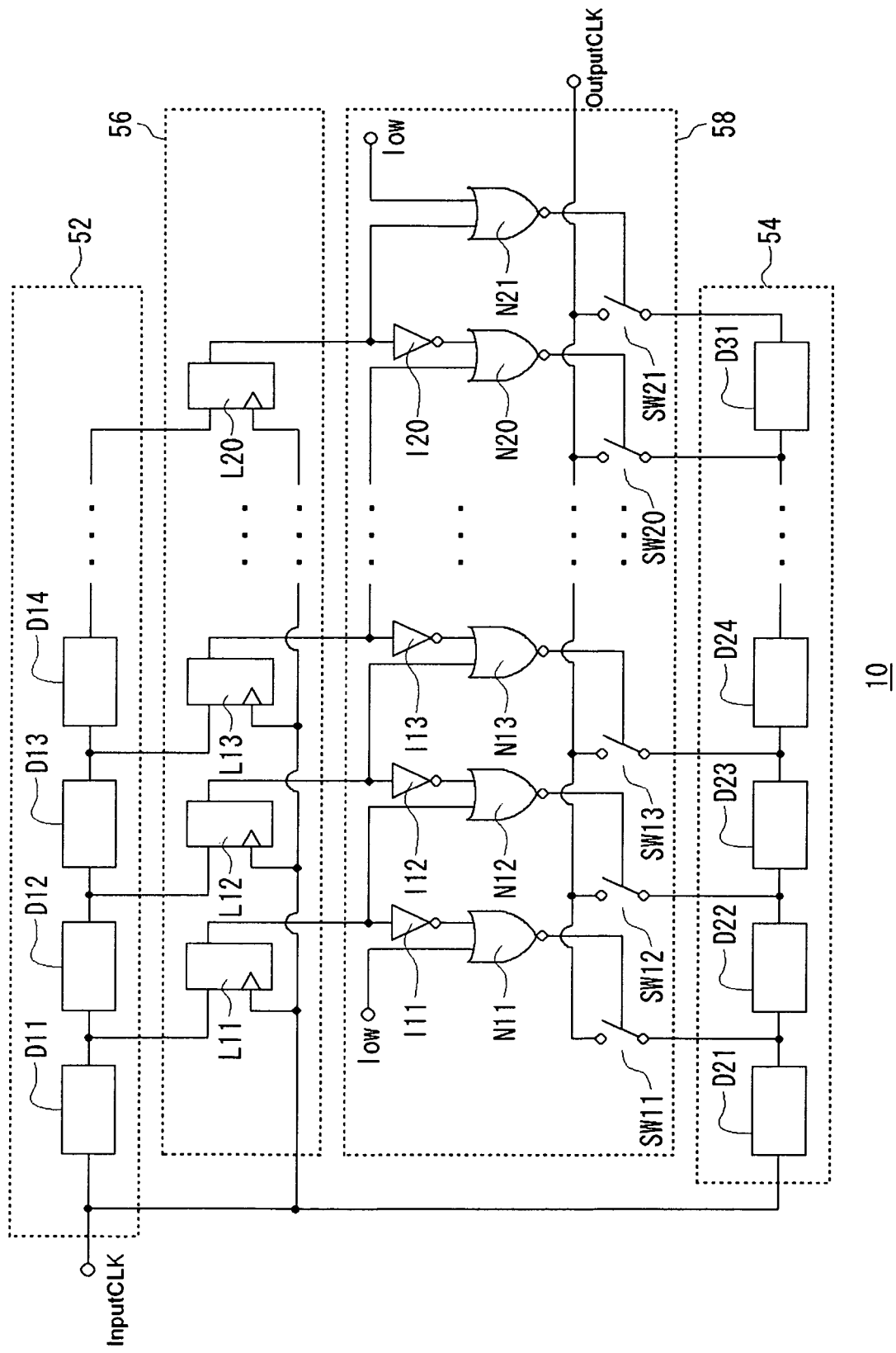
FIG. 6 is a circuit diagram showing a structure of a delay circuit according to a third embodiment of the present invention.

FIG. 6 is a circuit diagram showing a structure of a delay circuit according to a third embodiment of the present invention. The circuit configurations of the first delay unit 52 and the detection unit 56 are the same as that of the first delay circuit 12 and the detection unit 16 according to the first embodiment. The selection unit 58 includes the first to the eleventh NOR gates N11 to N21 as eleven NOR gates, the first to the tenth NOT gates I11 to I20 as ten NOT gates, and the first to the eleventh switches SW11 to SW21 as eleven switches. The second delay unit 54 includes the eleventh to the twenty-first delay elements D21 to D31 as eleven delay elements.

The selection unit 58 has two more NOR gates, one more NOT gate, and two more switches than the selection unit 18 according to the first embodiment. Also, the second delay unit 54 has one more delay element than the second delay unit 14 according to the first embodiment.

Each of the first to the tenth NOR gates N11 to N20 corresponds to one of the first to the tenth latch circuits L11 to L20 on one-on-one basis, respectively. In the selection unit 58, the first NOR gate N11 receives a signal which is always "Low" and a signal obtained by inverting the output from the first latch circuit L11 and outputs the result of the NOR operation with these two signals. The second NOR gate N12 receives a signal obtained by inverting the output from the second latch circuit L12 and a signal outputted from the first latch circuit L11, and outputs the result of the NOR operation with these two signals. The eleventh NOR gate N21 receives a signal which is always "Low" and a signal outputted from the tenth latch circuit L20 and outputs the result of the NOR operation with these two signals.

Each of the first to the eleventh NOR gates N11 to N21 corresponds to one of the first to the eleventh switches SW11 to SW21 on one-on-one basis, respectively. "High" signals outputted from any of the first to the eleventh NOR gates N11 to N21 turn on the corresponding switches.

Each of the eleventh to the twenty-first delay elements D21 to D31 corresponds to one of the first to the eleventh switches SW11 to SW21 on one-on-one basis, repectively. The output signal outputted from the corresponding delay element to a switch turned on among the first to the eleventh switches SW11 to SW21, is outputted outside of the delay circuit 10 as the output clock signal OutputCLK.

In the first delay unit 52, for example, when the first delay element D11 and the second delay element D12 are used for delaying by the reference time elapsed, the first latch circuit L11 and the second latch circuit L12 output "Low" and the rest of latch circuits that follow output "High". In this case, the first NOR gate N11 and the second NOR gate N12 output "Low" and the third NOR gate N13 outputs "High". The fourth NOR gate N14 and the rest of the NOR gates that follow output "Low". Among the first to the eleventh switches SW11 to SW21, since the third switch SW13, the corresponding switch to the third NOR gate N13, is turned on, the output from the thirteenth delay element D23 is outputted via the third switch SW13 outside of the delay circuit 10 as the output clock signal OutputCLK. In case that two delay elements, the first delay element D11 and the second delay element D12, are used in the first delay unit 52 for delaying, three delay elements, the eleventh delay element D21, the twelfth delay element D22, and the thirteenth delay element D23, used in the second delay unit 54 for delaying. In case that there is an increase or decrease in the number of delay elements used in the first delay unit 52, the number of delay elements used in the second delay unit 54 is increased or decreased by delay elements which are the same in number with the delay elements increased or decreased in the first delay unit 52.

In case that a reference time in the first delay unit 52 is smaller than the smallest delay time which can be measured by the delay elements in the first delay unit 52, all of the first to the tenth latch circuits L11 to L20 output "High", not "Low". However, even in that case, at least the first NOR gate N11 can output "High", so the eleventh delay element D21 among a plurality of delay elements in the second delay unit 54 is selected to output the output clock signal OutputCLK via the first switch SW11 outside of the delay circuit 10. On the other hand, in case that a reference time in the first delay unit 52 is larger than the largest delay time which can be measured by the delay elements in the first delay unit 52, all of the first to the tenth latch circuits L11 to L20 output "Low", not "High". However, even in that case, at least the eleventh NOR gate N21 can output "High", so the twenty-first delay element D31 among a plurality of delay elements in the second delay unit 54 is selected to output the output clock signal OutputCLK via the eleventh switch SW21 outside of the delay circuit 10. Note that there may be modifications of the configuration of the selection unit 58 according to this embodiment with a correction circuit incorporated in order to force the selection of the eleventh delay element D21 when all of the first to the tenth latch circuits L11 to L20 output "High" and with a correction circuit incorporated in order to force the selection of the twenty-first delay element D31 when all of the first to the tenth latch circuits L11 to L20 output "Low".

Fourth Embodiment

A fourth embodiment of the present invention describes an example that each of the delay values of delay elements in the first delay unit 12 are different from each other and each of the delay values of the delay elements in the second delay unit 14 are also different from each other. Note that while the fourth embodiment uses the delay circuit 10 shown in FIG. 1 according to the first embodiment, however, there is no restriction on the choice of it.

FIG. 7 is a table showing an example of the delay values of the eleventh to the twentieth delay elements D21 to D30 in a second delay unit 14 according to a fourth embodiment of the present invention. In this example, the thirteenth to the twentieth delay elements D23 to D30 in the second delay unit 14 are configured to increase the delay value from the previous delay element in increments from the input side. The third to the tenth delay elements D13 to D20 in the first delay unit 12 are configured to increase the delay value from the previous delay element in increments from the input side as well. In the case where the technique of this embodiment is applied to the configuration of the second embodiment shown in FIG. 5, i.e, in the case of applying the configuration that the selection unit 48 selects delay elements in the second delay unit 44 to input the input clock signal InputCLK, the twelfth to the nineteenth delay elements D22 to D29 have delay values that decrease from the previous delay element in increments from the input side.

According to this embodiment, each ratio (referred as to delay step ratio in the table shown in FIG. 7) of delay times of the twelfth to the twentieth delay elements D22 to D30 to the total delay time in the second delay unit 14 can be lined up with about 10%. The same holds for the second to the tenth delay elements D12 to D20 in the first delay unit 12. Consequently, variations in delay values which prevents a desired delay time from being obtained can be restrained by the number of delay elements used for delaying the input clock signal.

FIG. 8 is another table showing an example of delay values of the eleventh to the twentieth delay elements D21 to D30 in the second delay 14 unit according to the fourth embodiment of the present invention. In this example, the fifteenth and the eighteenth delay elements D25 and D28 in the second delay unit 14 are configured to increase the delay value from the previous delay element. That is to say, the second delay unit 14 is configured to include some delay elements with the delay value increased from the previous delay element. In this case, variations in delay values which prevents a desired delay time from being obtained can be restrained by the number of delay elements used for delaying the input clock signal as well.

For clarity of the effect in this embodiment, a comparative example is now described. FIG. 9 is an additional table showing a comparative example of delay values of the eleventh to the twentieth delay elements D21 to D30 in the second delay unit 14 according to the fourth embodiment of the present invention. In this comparative example, the delay values of the twelfth to the twentieth delay elements D22 to D30 are configured to be the same. Each delay step ratio, a ratio of each delay value of delay elements to the accumulated delay time resides between 6.8% and 15%, so there are variations in a desired delay time depending on the number of delay elements used for delaying the input clock signal. This means that the fewer delay elements used for delaying the input clock signal, the more the error rate to the desired delay time. On the other hand, when the number of delay elements used for delaying the input clock signal is too large, the delay step ratio of delay times in the latter delay elements becomes unnecessarily small, which is redundantly. This embodiment can appropriately solve such problems.

Figure 10A:
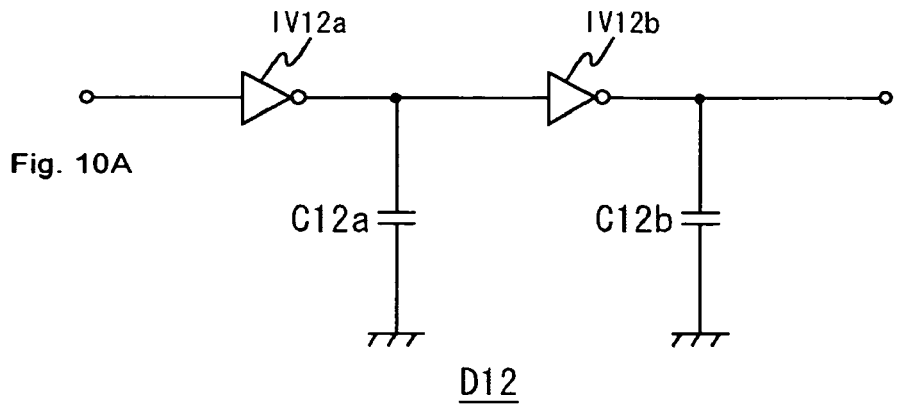
FIG. 10A is a circuit diagram showing a structure of the second delay element D12 in the first delay unit 12.
Figure 10B:
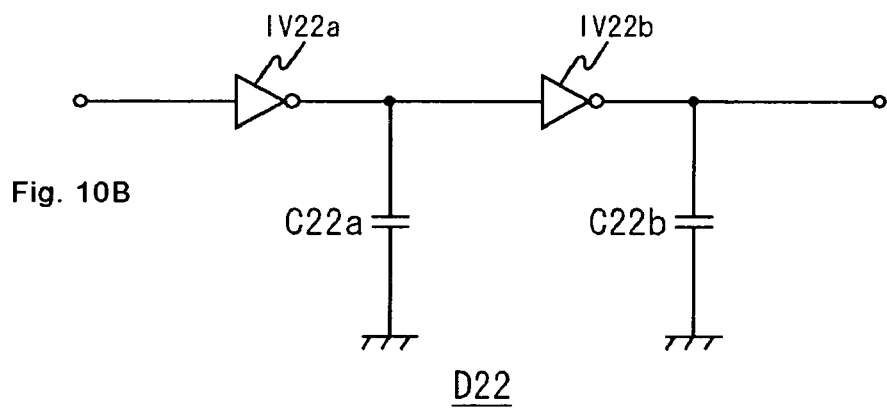
FIG. 10B is a circuit diagram showing a structure of the twelfth delay element D22 in the second delay unit 14.

FIGS. 10A and 10B show examples in circuit configuration of the delay elements included in the first delay unit 12 and the second delay unit 14. FIG. 10A is a circuit diagram showing a structure of the second delay element D12 in the first delay unit 12. The second delay element D12 shown in FIG. 10A includes a first inverter IV12a, a second inverter IV12b, a first capacitor C12a, and a second capacitor C12b. The first inverter IV12a and the second inverter IV12b are connected in series on a path of the input clock signal. The first capacitor C12a is disposed between the output terminal of the first inverter IV12a and ground. The second capacitor C12b is disposed between the output terminal of the second inverter IV12b and ground.

FIG. 10B is a circuit diagram showing a structure of the twelfth delay element D22 in the second delay unit 14, which is the same configuration as the second delay element D12 shown in FIG. 10A. However, the size and the driving capacity of transistors which constitute the inverter (hereinafter referred as to the driving capacity of inverters) and the capacitance of the capacitors are different from that of D12 shown in FIG. 10A. That is to say, the driving capacities of a third inverter IV22a and a fourth inverter IV22b are larger than that of the first inverter IV12a and the second inverter IV12b. Therefore, the delay value of the twelfth delay element D22 is smaller than the delay value of the second delay element D12. In addition, the capacitance of a third capacitor C22a and the capacitance of a fourth capacitor C22b are smaller than that of the first capacitor C12a and that of the second capacitor C12b. Consequently, the delay value of the twelfth delay element D22 is smaller than that of the second delay element D12.

Figure 11A:
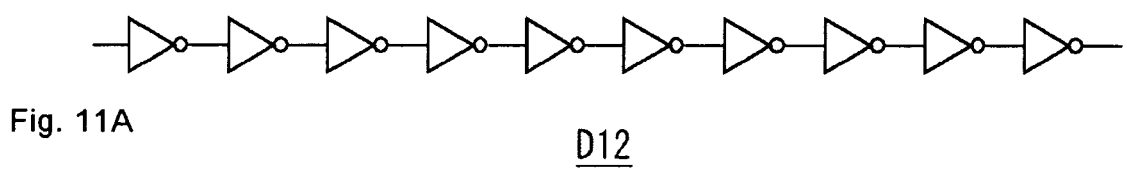
FIG. 11A is a circuit diagram showing another structure of the second delay element D12 in the first delay unit 12.
Figure 11B:
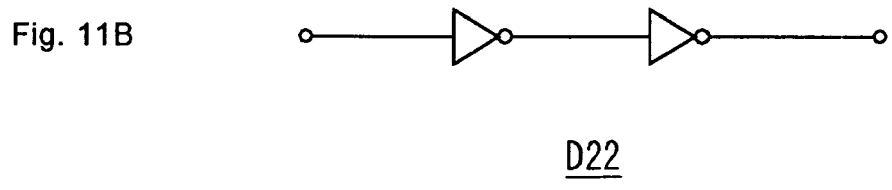
FIG. 11B is a circuit diagram showing another structure of the twelfth delay element D22 in the second delay unit 14.

FIGS. 11A and 11B show additional examples in circuit configuration of the delay elements included in the first delay unit 12 and the second delay unit 14. FIG. 11A is a circuit diagram showing another structure of the second delay element D12 in the first delay unit 12 and FIG. 11B is a circuit diagram showing another structure of the twelfth delay element D22 in the second delay unit 14. The second delay element D12 shown in FIG. 11A includes ten inverters connected in series on a path of the input clock signal. The twelfth delay element D22 shown in FIG. 11B includes two inverters connected in series on a path of the input clock signal. The driving capacity of each inverter is the same.

In the examples shown in FIGS. 11A and 11B, by adjusting the number of inverters included in the delay element, a ratio between the delay value of the second delay element D12 and the delay value of the twelfth delay element D22 is adjusted. Note that a ratio of delay values may be adjusted by changing the driving capacity of inverters and the number of inverters.

Although the present invention has been fully described by the above-mentioned embodiments, it is to be noted that various changes and modifications in the combinations of constituents and handling process will be apparent to those skilled in the art. Therefore, unless otherwise such changes and modifications depart from the scope of the present invention, they should be construed as being included therein. Some of the modified embodiments are introduced hereinafter.

Figure 12:
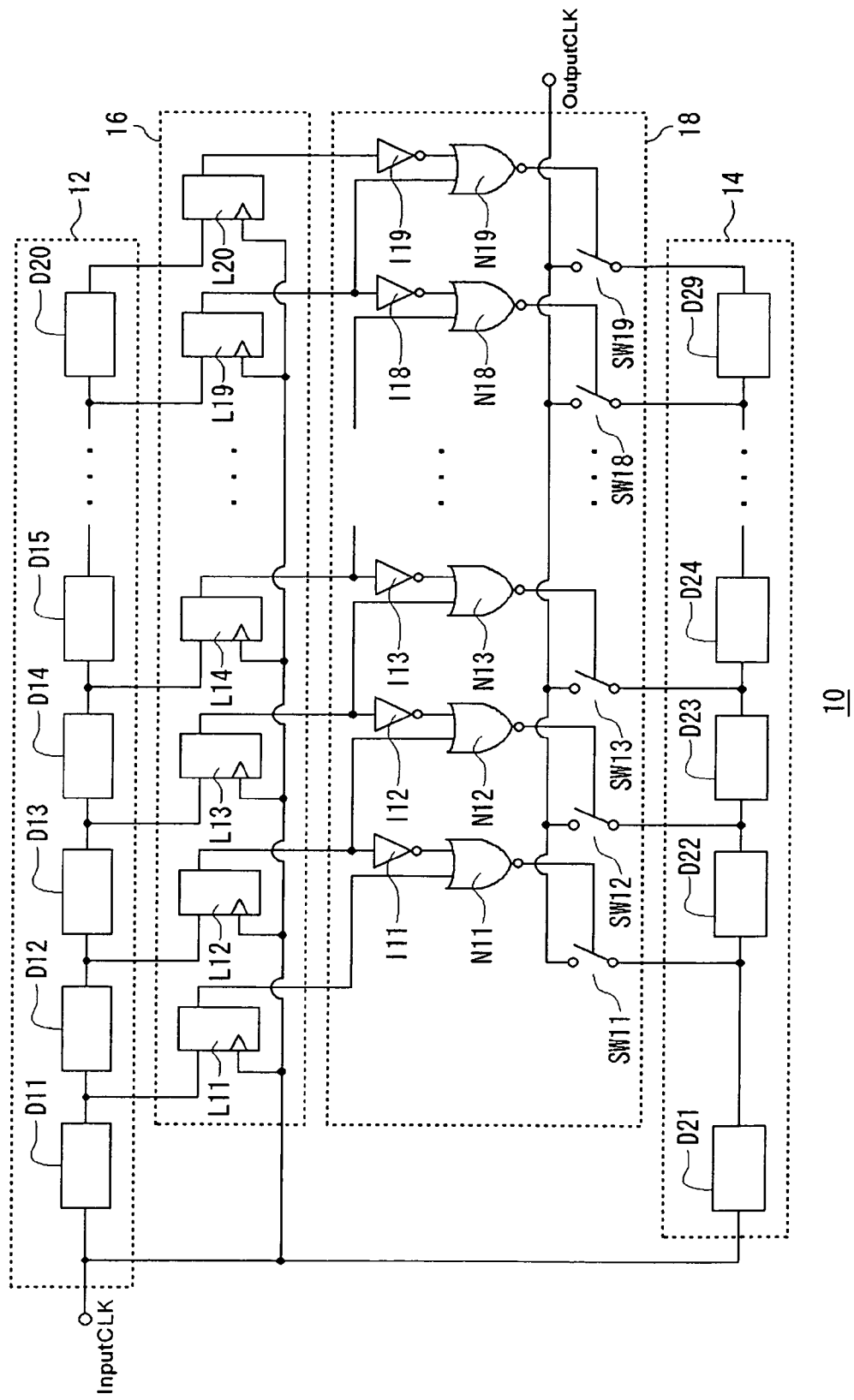
FIG. 12 is a circuit diagram showing a structure of a delay circuit according to a first modification of the first embodiment of the present invention.

FIG. 12 is a circuit diagram showing a structure of a delay circuit according to a first modification of the first embodiment of the present invention. The delay circuit 10 shown in FIG. 12 does not include the twentieth delay element D30 in the second delay unit 14 and delay elements used depending on the on/off of the first to the ninth switches SW11 to SW19 are shifted to the left, which are the differences from the delay circuit 10 shown in FIG. 1. When the first switch SW11 is turned on, the output signal from the eleventh delay element D21 is chosen to be outputted as the output clock signal OutputCLK in FIG. 12 while the output signal from the twelfth delay element D22 is chosen to be outputted as the output clock signal OutputCLK in FIG. 1. In this modified embodiment, the same effect can be expected as in the first embodiment.

Figure 13:
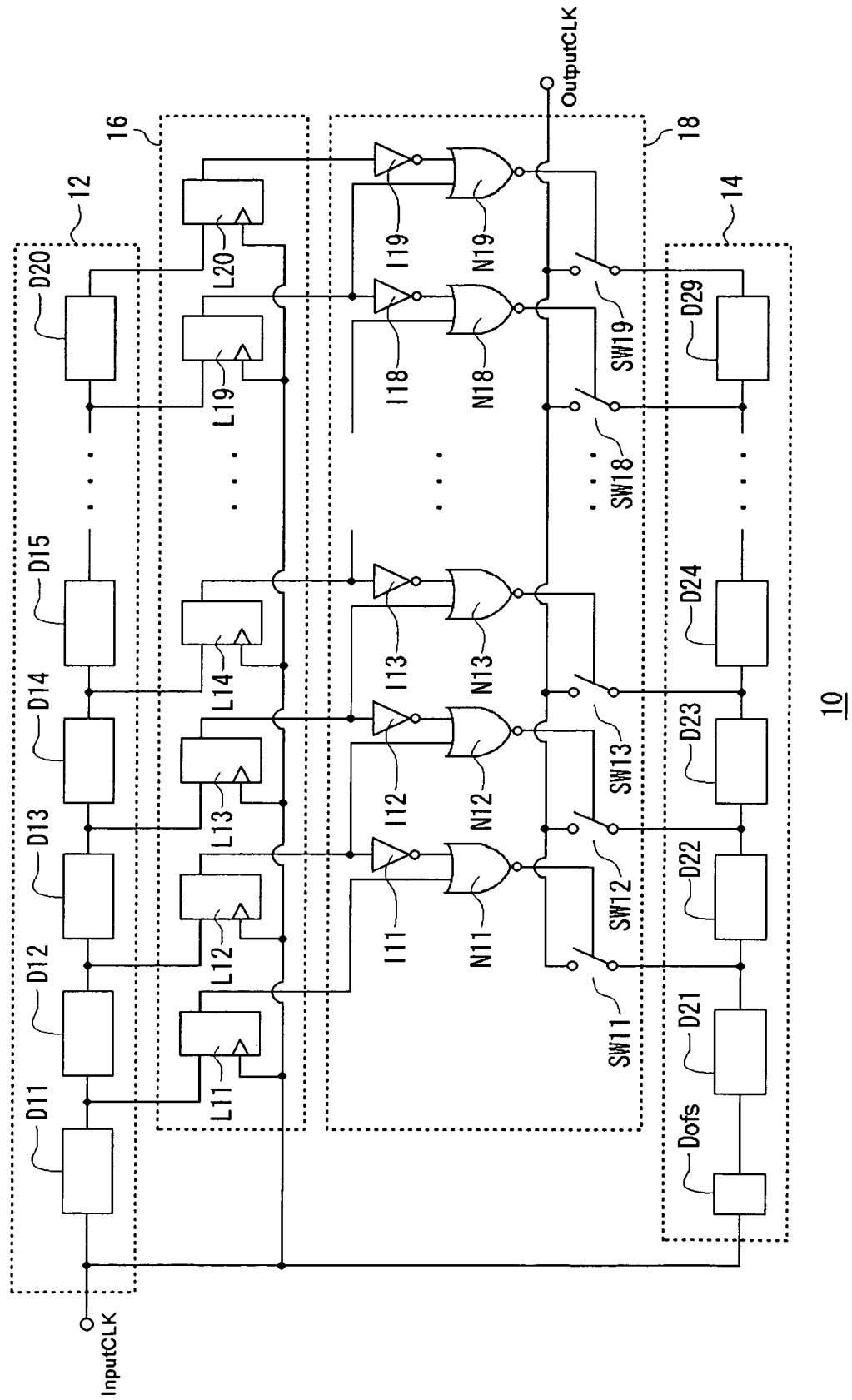
FIG. 13 is a circuit diagram showing a structure of a delay circuit according to a second modification of the first embodiment of the present invention.

FIG. 13 is a circuit diagram showing a structure of a delay circuit according to a second modification of the first embodiment of the present invention. The delay circuit 10 shown in FIG. 13 includes an offset delay element Dofs in the second delay unit 14, which is a difference from the delay circuit 10 shown in FIG. 12. According to this modified embodiment, a slight increase in the delay time by the offset delay element Dofs in the second delay unit 14 can enhance the accuracy in the delay time of the output clock signal OutputCLK in accordance with the configuration of the delay circuit 10.

In addition, a slight decrease in the delay value of the eleventh delay element D21 may be achieved by increasing the driving capacity of inverters in the circuit configuration shown in FIG. 1. In this case, the accuracy in the delay time of the output clock signal OutputCLK can be enhanced in accordance with the configuration of the delay circuit 10.

Figure 14:
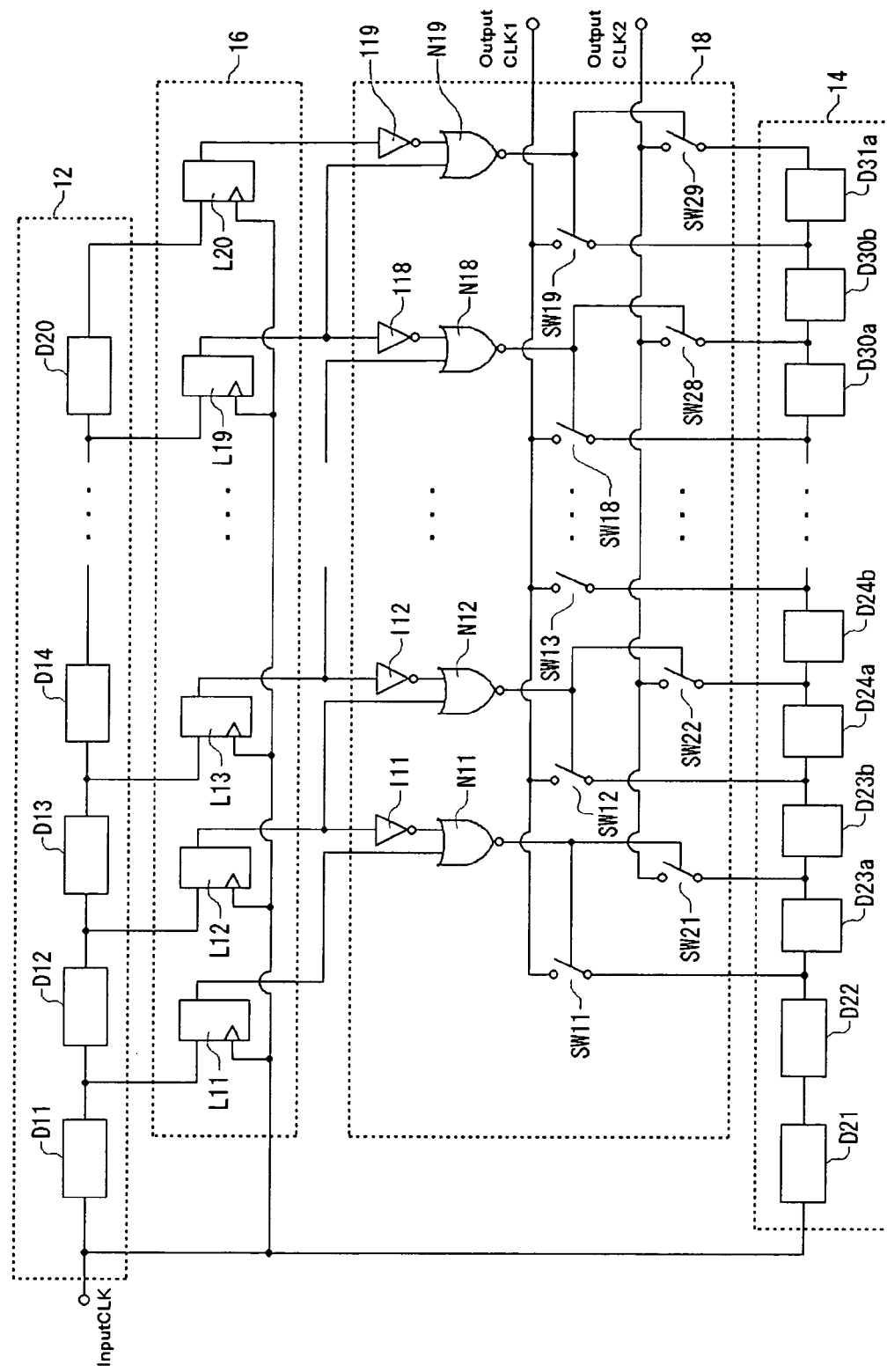
FIG. 14 is a circuit diagram showing a structure of a delay circuit according to a third modification of the first embodiment of the present invention.

FIG. 14 is a circuit diagram showing a structure of a delay circuit according to a third modification of the first embodiment of the present invention. The delay circuit 10 shown in FIG. 14 is configured to output two signals with different delay values by the thirteenth to the twentieth delay elements D23 to D30 in the second delay unit 14, which is a difference from the delay circuit 10 shown in FIG. 1. That is to say, the delay circuit 10 shown in FIG. 14 further includes the tenth to the eighteenth switches SW21 to SW29 turned on/off synchronously with the first to the ninth switches SW11 to SW19 and two different output clock signals in delay time, OutputCLK1 and OutputCLK2, are outputted via these switches. According to this modified embodiment, the thirteenth to the twentieth delay elements D23 to D30 are divided into former step side and latter step side respectively, and the twenty-first delay element D31a is added in the second delay unit 14. Hereinafter, the former step side of the thirteenth delay element D23 is represented as a former-thirteenth delay element D23a and the latter step side of the thirteenth delay element D23 is represented as a latter-thirteenth delay element D23b. The former and latter step sides of the fourteenth to the twentieth delay elements D24 to D30 are represented in the same manner as well. When a delay element constitutes four inverters connected in series, the former steps of two out of four inverters are identified as delay elements in former step side and the latter steps of two out of four inverters are identified as delay elements in the latter step side. When a delay element constitutes six inverters connected in series, the former steps of two out of six inverters may be identified as delay elements in the former step side and the latter steps of four out of six inverters may be identified as delay elements in the latter step side. The delay elements in the former step side and the latter step side have arbitrary ratio of delay value. According to this modified embodiment, the delay circuit 10 can have a broader scope of application since two output signals with different delay time can be obtained.

In each embodiment describe above, the detection unit 16, 46, and 56 detect the number of delay elements in the first delay unit 12, 42, and 52, respectively on the rising edge of the input clock signal InputCLK. However, in the modification on this, the detection unit 16, 46, and 56 may detect the number of delay elements in the first delay unit 12, 42, and 52, respectively on the falling edge of the input clock signal InputCLK.

What is claimed is:

1. A delay circuit comprising:
a first delay unit including a plurality of first delay elements connected in series, and receiving a first input signal;
a second delay unit including a plurality of second delay elements connected in series, a number of elements being determined in accordance with the number of first delay elements included in the first delay unit, and the second delay unit receiving a second input signal identical with the first input signal and outputting an output signal obtained by delaying the second input signal by a desired delay time (Tt);
a detection unit that receives a plurality of output signals from the plurality of first delay elements included in the first delay unit occurring after a predetermined reference time (Tr) since a rising edge or a falling edge of the first input signal is fed to the first delay unit and detects the first delay element outputting an inverted output signal, so as to detect the number of first delay elements used in said first delay unit to delay the first input signal by the reference time (Tr); and
a selection unit that, of the output signals from the plurality of second delay elements included in the second delay unit, selects, as the output signal of the second delay unit, the output signal from the second delay element located at the end of a group of second delay elements starting at the element at the input, the number of elements in the group being determined in accordance with the number of first delay elements detected by the detection unit,
wherein first delay values (Vd1) applied by the first delay elements included in the first delay unit to a signal input to the first delay element, second delay values (Vd2) applied by the corresponding second delay elements included in the second delay unit to a signal input to the second delay element, and the reference time (Tr) are set so that the ratio (Vd2/Vd1) is equivalent to the ratio (Tt/Tr) between said reference time (Tr) set in the first delay unit and the desired delay time (Tt).

2. The delay circuit according to claim 1, wherein said selection unit selects the output signal from the delay element located at the end of the group of second delay elements as viewed from the input side such that the delay element forward or backward is selected depending on an increase or decrease in the number of first delay elements detected by the detection unit as being required to delay the first input signal by the reference time (Tr).

3. The delay circuit according to claim 1, wherein at least one of the first delay elements among said plurality of first delay elements connected in series in said first delay unit have a delay value different from the delay value of the other first delay elements.

4. The delay circuit according to claim 1, wherein said selection unit selects the output signal of the second delay element, of the plurality of second delay elements included in the second delay unit, located closest to the output side when said reference time (Tr) is larger than a maximum delay time by which said first delay unit is capable of delaying the first input signal.

5. The delay circuit according to claim 1, wherein said selection unit selects the output signal of the second delay element, of the plurality of second delay elements included in the second delay unit, located closest to the input side when said reference time (Tr) is smaller than a minimum delay time by which said first delay unit is capable of delaying the first input signal.

6. The delay circuit according to claim 1, wherein:
wherein the second delay values (VD2) is smaller than the first delay value (Vd1).

7. The delay circuit according to claim 6, wherein said selection unit selects the output signal from the delay element located at the end of the group of second delay elements as viewed from the input side such that the delay element forward or backward is selected depending on an increase or decrease in the number of first delay elements detected by the detection unit as being required to delay the first input signal by the reference time (Tr).

8. The delay circuit according to claim 6, wherein at least one of the first delay elements among said plurality of first delay elements connected in series in said first delay unit have a delay value different from the delay value of the other first delay elements.

9. The delay circuit according to claim 1, wherein
the number of first delay elements and the number of second delay elements are equal,
the detection unit detects the number of first delay elements (n) required for the first delay unit to delay the first input signal by the reference time (Tr), and
of the plurality of output signals respectively output from the plurality of second delay elements included in the second delay unit, the selection unit selects the output signal of the n-th second delay element from the input side.

10. A delay circuit comprising:
a first delay unit including a plurality of first delay elements connected in series, and receiving a first input signal;
a second delay unit including a plurality of second delay elements connected in series, receiving a second input signal identical with the first input signal, and outputting an output signal obtained by delaying the second input signal by a desired delay time (Tt);
a detection unit that receives a plurality of output signals from the plurality of first delay elements included in the first delay unit occurring after a predetermined reference time (Tr) since a rising edge or a falling edge of the first input signal is fed to the first delay unit and detects the first delay element outputting an inverted output signal, so as to detect the number of first delay elements used in said first delay unit to delay the first input signal by the reference time (Tr); and
a selection unit feeds the second input signal to the input terminal of the second delay element located at the end of a group of second delay elements starting at the element at the output, the number of elements in the group being determined in accordance with the number of first delay elements detected by the detection unit,
wherein first delay values (Vd1) applied by the first delay elements included in the first delay unit to a signal input to the first delay element, second delay values (Vd2) applied by the corresponding second delay elements included in the second delay unit to a signal input to the second delay element, and the reference time (Tr) are set so that the ratio (Vd2/Vd1) is equivalent to the ratio (Tt/Tr) between said reference time (Tr) set in the first delay unit and the desired delay time (Tt).

11. The delay circuit according to claim 10, wherein at least one of the second delay elements among said plurality of second delay elements connected in series in said second delay unit have a delay value different from the delay value of the other second delay elements.

12. The delay circuit according to claim 10, wherein:
a selection unit feeds the second input signal to the input terminal of the second delay element located at the end of a group of second delay elements starting at the element at the output, the number of elements in the group being determined in accordance with the number of first delay elements detected by the detection unit,
wherein the second delay values (Vd2) is smaller than the first delay value (Vd1).

13. The delay circuit according to claim 12, wherein at least one of the second delay elements among said plurality of second delay elements connected in series in said second delay unit have a delay value different from the delay value of the other second delay elements.

* * * * *